US006828792B1

(12) United States Patent
Danby et al.

(10) Patent No.: US 6,828,792 B1
(45) Date of Patent: Dec. 7, 2004

(54) MRI APPARATUS AND METHOD FOR IMAGING

(75) Inventors: Gordon T. Danby, Wading River, NY (US); William H. Wahl, Smithtown, NY (US); Raymond V. Damadian, Woodbury, NY (US); Anthony J. Giambalvo, Kings Park, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/438,353

(22) Filed: May 14, 2003

Related U.S. Application Data

(63) Continuation-in-part of application No. 09/718,946, filed on Nov. 22, 2000, now Pat. No. 6,677,753.
(60) Provisional application No. 60/436,382, filed on Dec. 24, 2002, provisional application No. 60/380,333, filed on May 14, 2002, and provisional application No. 60/167,460, filed on Nov. 24, 1999.

(51) Int. Cl.[7] .................................................. G01V 3/00
(52) U.S. Cl. ...................................... 324/318; 324/319
(58) Field of Search ............................... 324/318, 319, 324/309, 307; 335/296

(56) References Cited

U.S. PATENT DOCUMENTS

| | | |
|---|---|---|
| 4,105,923 A | 8/1978 | Hynes, Jr. |
| 4,534,076 A | 8/1985 | Barge |
| 4,534,358 A | 8/1985 | Young |
| 4,567,894 A | 2/1986 | Bergman |
| 4,629,989 A | 12/1986 | Riehl et al. |
| 4,727,328 A | 2/1988 | Carper et al. |
| 4,829,252 A | 5/1989 | Kaufman |
| 4,908,844 A | 3/1990 | Hasegawa |
| 4,924,198 A | 5/1990 | Laskaris |
| 4,968,937 A | 11/1990 | Akgun |
| 4,985,678 A | 1/1991 | Gangarosa et al. |
| 5,008,624 A | * 4/1991 | Yoshida ...................... 324/318 |
| 5,065,761 A | 11/1991 | Pell |
| 5,153,546 A | * 10/1992 | Laskaris ...................... 335/216 |
| 5,155,758 A | 10/1992 | Vogl |
| 5,162,768 A | 11/1992 | McDougall et al. |
| 5,197,474 A | 3/1993 | Englund et al. |
| 5,259,011 A | 11/1993 | Petro |

(List continued on next page.)

FOREIGN PATENT DOCUMENTS

| | | |
|---|---|---|
| JP | 1-242056 | 9/1989 |
| WO | WO-97/17896 | 5/1997 |

OTHER PUBLICATIONS

Four (4) photographs of an exhibit at the Radiological Society for North America held in Dec. 1996.
U.S. patent application 09/789,460 filed Nov. 22, 2000.

*Primary Examiner*—Brij B. Shrivastav
(74) *Attorney, Agent, or Firm*—Lerner, David, Littenberg, Krumholz & Mentlik, LLP

(57) ABSTRACT

Apparatus and methods for performing magnetic resonance imaging. In an embodiment the apparatus comprises a pair of elements spaced apart from each other along a horizontal pole axis so as to define a patient receiving space therebetween. A patient support device is located within the patient receiving space and is operable to accept a patient who enters the patient receiving space in an upright position, e.g., walking. In another embodiment the apparatus comprises a pair of elements supported within a frame. The frame includes upper and lower flux return members that are smaller in a vertical dimension than in a horizontal dimension. In another embodiment, the apparatus comprises a pair of elongated pole members that define an imaging volume having a longer dimension in a vertical direction than in a horizontal direction. An exemplary method includes performing a full body scan of a patient in an upright or sitting position.

39 Claims, 13 Drawing Sheets

U.S. PATENT DOCUMENTS

| | | |
|---|---|---|
| 5,305,365 A | 4/1994 | Coe |
| 5,305,749 A | 4/1994 | Li et al. |
| 5,349,956 A | 9/1994 | Bonutti |
| 5,386,447 A * | 1/1995 | Siczek .................. 378/37 |
| 5,436,607 A | 7/1995 | Chari et al. |
| 5,475,885 A | 12/1995 | Ishikawa |
| 5,592,090 A * | 1/1997 | Pissanetzky ............. 324/369 |
| 5,606,970 A | 3/1997 | Damadian |
| 5,623,241 A | 4/1997 | Minkoff |
| 5,624,159 A | 4/1997 | Celoni et al. |
| 5,640,958 A | 6/1997 | Bonutti |
| 5,735,278 A | 4/1998 | Hoult et al. |
| 5,743,264 A | 4/1998 | Bonutti |
| 5,779,637 A | 7/1998 | Palkovich et al. |
| 5,983,424 A | 11/1999 | Naslund |
| 6,014,070 A * | 1/2000 | Danby et al. ............. 335/296 |
| 6,023,165 A | 2/2000 | Damadian et al. |
| 6,246,239 B1 | 6/2001 | Krogmann et al. |
| 6,335,623 B1 | 1/2002 | Damadian et al. |
| 6,411,088 B1 | 6/2002 | Kuth et al. |
| 6,414,490 B1 * | 7/2002 | Damadian et al. ......... 324/319 |

* cited by examiner

MRI APPARATUS AND METHOD FOR IMAGING

CROSS-REFERENCE TO RELATED APPLICATIONS

The present application claims the benefit of U.S. Provisional Application No. 60/380,333, filed on May 14, 2002 and entitled "Erect Position Imaging Magnet With Vertical Elongated Poles," and 60/436,382 filed on December 24, 2002 and entitled "MRI Imaging Magnet With Low Height Cross Member," the disclosures of which are hereby incorporated in their entirety by reference herein. The present application is also a continuation-in-part of U.S. application Ser. No. 09/718,946, filed on Nov. 22, 2000 now U.S. Pat. No. 6,677,753 and entitled "Stand-Up MRI Apparatus" ("the '946 application"), which claims the benefit of U.S. Provisional Application No. 60/167,460, filed Nov. 24, 1999, the disclosures of which are also hereby incorporated by reference herein.

BACKGROUND

The present invention relates to magnetic resonance imaging systems, apparatus and procedures. In magnetic resonance imaging, an object to be imaged as, for example, a body of a human subject, is exposed to a strong, substantially constant static magnetic field. The static magnetic field causes the spin vectors of certain atomic nuclei within the body to randomly rotate or "precess" around an axis parallel to the direction of the static magnetic field. Radio frequency excitation energy is applied to the body, and this energy causes the precessing atomic nuclei to rotate or "precess" in phase and in an excited state. As the precessing atomic nuclei relax, weak radio frequency signals are emitted; such radio frequency signals are referred to herein as magnetic resonance signals. Different tissues produce different signal characteristics. Furthermore, relaxation times are a dominant factor in determining signal strength. In addition, tissues having a high density of certain nuclei will produce stronger signals than tissues with a low density of such nuclei. Relatively small gradients in the magnetic field are superimposed on the static magnetic field at various times during the process so that magnetic resonance signals from different portions of the patient's body differ in phase and/or frequency. If the process is repeated numerous times using different combinations of gradients, the signals from the various repetitions together provide enough information to form a map of signal characteristics versus location within the body. Such a map can be reconstructed by conventional techniques well known in the magnetic resonance imaging art, and can be displayed as a pictorial image of the tissues as known in the art.

The magnetic resonance imaging technique offers numerous advantages over other imaging techniques. MRI does not expose either the patient or medical personnel to X-rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

The magnets used in MRI imaging must provide a magnetic field that is strong and uniform. Preferably, the magnet of the MRI imaging apparatus has a patient-receiving space capable of receiving the torso of a normal human being, and provides a field strength of preferably at least about 3 kilogauss or more. This field desirably is uniform to within about a few parts in $10^6$ or better in an imaging volume at least about 25 cm in diameter in the patient-receiving space.

The required fields can be generated by a so-called air-core solenoidal superconducting magnet. These magnets have coils positioned along a horizontal axis and a tubular central bore inside the coils. The patient is placed inside this tubular bore while he or she is being imaged. Although magnets of this type can provide acceptable images, they subject the patient to an intensely claustrophobic experience for the duration of the imaging procedure. Moreover, these magnets inherently require that the imaging procedure be conducted with the patient in a horizontal orientation, lying prone or supine on a bed.

More advanced magnetic resonance imaging magnets as described, for example, in certain embodiments of commonly assigned U.S. Pat. No. 6,014,070 ("the '070 patent") provide a ferromagnetic frame with upper and lower pole support plates connected to one another by a set of columns disposed around the periphery of the pole support plates. Ferromagnetic poles projecting upwardly and downwardly from the pole support plates along a vertical axis define a patient-receiving gap. A patient may be disposed in the gap and subjected to a magnetic flux directed through the poles. The columns carry magnetic flux in a return flux path between the poles. As disclosed in the '070 patent, the columns can be configured to provide a very open environment around the patient receiving gap, so that the patient is not subjected to a claustrophobic experience and so that the patient is readily accessible to medical personnel and also can provide a strong, highly uniform magnetic field for high-quality imaging. In certain embodiments disclosed in the '070 patent, the poles are elongated so as to provide the uniform magnetic field over a similarly elongated region. However, magnets of this type still require the patient to assume a generally horizontal orientation.

Proposals have been advanced for magnetic resonance imaging magnets with ferromagnetic poles spaced apart from one another along a horizontal axis. As disclosed in commonly assigned U.S. Pat. No. 6,414,490 ("the '490 patent"), the disclosure of which is hereby incorporated by reference herein, a particularly desirable arrangement for such a magnet includes a generally cubical structure having a pair of opposed, vertically extending side walls and poles projecting inwardly from the side walls along a horizontal pole axis. The poles define vertically extending pole faces and a patient receiving space between these pole faces. The frame also includes upper and lower flux return structures extending between the side walls. As disclosed in greater detail in the '490 patent, a patient can be positioned within the patient receiving space in a variety of orientations, ranging from a fully horizontal orientation reclining on a bed to a sitting or standing orientation in which the long axis of the patient's torso extends substantially vertically. Moreover, the patient can be moved so as to align various regions of the patient's body with the pole axis and thus bring various regions of the body into the imaging volume. In a particularly preferred arrangement taught in the '490 patent, the upper and lower flux return structures define apertures and the patient support is arranged to move the patient upwardly and downwardly. For example, a patient in a standing position can be elevated so that his head projects into or through the aperture in the upper flux return structure while his legs and feet are disposed in the imaging volume, near the polar axis. The patient can be lowered so as to place his head in the imaging volume, near the polar axis while his feet project downwardly into or through the aperture in the lower flux return structure. Magnets according to the preferred embodiments taught in the '490 patent provide a unique combination of versatility in positioning and a high quality magnetic field.

However, still further improvement would be desirable. In particular, the range of motion required to position any portion of a standing, normal size human adult within the imaging volume may be reduced. In addition, the total vertical clearance necessary to house a magnet that is capable of moving a standing patient through such entire range of motion may be also reduced within the limits that are currently required. Thus, it is desirable to have a magnet resonance imaging apparatus that requires a relatively low vertical clearance space and reduced range of motion to obtain a full body scan of a patient.

SUMMARY

In accordance with an embodiment of the present invention, a magnetic resonance imaging apparatus comprises a frame including a pair of side walls extending in a vertical direction. A pair of elements project from the side walls and are spaced apart along a horizontal pole axis so as to define a patient-receiving space therebetween. The apparatus further includes upper and lower flux return members extending between the side walls. The flux return members each have a width dimension extending substantially transverse to the direction of the side walls and the horizontal pole axis and a vertical dimension extending substantially parallel to the direction of the side walls. The vertical dimension is desirably substantially smaller than the width dimension.

Further in accordance with this embodiment, it is desirable to have the ratio of the width to vertical dimension to be at least 1.5:1 and most desirably to be 2:1, 4:1, 5:1 or more.

This embodiment may further desirably include an imaging volume defined by the elements such that the vertical dimension of the imaging volume is larger than the horizontal dimension of the imaging volume along the pole axis.

In accordance with another embodiment, a magnetic resonance imaging apparatus preferably comprises a pair of substantially elliptical elements that are spaced apart from each other along a horizontal pole axis so as to define a patient-receiving space therebetween. The magnet is operable to direct flux between the elements.

Further in accordance with this embodiment, the apparatus desirably includes a pair of extending side walls. Each of the side walls abut each of said elements and form a surface from which the elements project.

The apparatus further desirably includes at least one upper flux return member and at least one lower flux return member that extend between the side walls.

In yet another embodiment a magnet resonance imaging apparatus comprises a magnet defining a substantially horizontal field axis and an imaging volume. The imaging volume is elongated in a vertical direction so that a vertical dimension of the imaging volume is greater than a horizontal dimension of the imaging volume transverse to the field axis. The apparatus further includes a patient support capable of supporting a human patient with the long axis of the patient's torso in a substantially vertical orientation.

In accordance with this embodiment the patient support is capable of moving the patient upwardly and downwardly so as to align different regions of the patient with the imaging volume.

Apparatus implemented in accordance with this embodiment desirably define an imaging volume having a vertical dimension of approximately 2 feet and most desirably of at least 3 feet.

The apparatus may further desirably include upper and lower flux return members extending between a pair of vertically extensive side walls spaced apart from each other. Each of the flux return members having a vertical dimension V and a horizontal dimension H, wherein H is greater than V. In a most preferred embodiment the ratio of H to V is at least 2:1.

Apparatus implemented in accordance with the principles and embodiments of the present invention advantageously allow for a magnet resonance imaging magnet that requires substantially less vertical space for installation. This advance over the prior art allows installation of such magnets in facilities that include a vertical clearance of about 9 feet or less. This results in such apparatus being available for installation at a lower cost in facilities previously thought unsuitable for installation of MRI imaging apparatus of the type manufactured and marketed under the trademark Stand-Up MRI by Fonar Corporation.

Apparatus embodying the principles of the present invention further advantageously provide a relatively large vertical space for entry and exit of the patient and further enhances the open feel of the magnet.

Furthermore, the smaller vertical dimension of the flux return members advantageously allow for the poles of the magnet to be of a larger diameter or be elongated in the vertical dimension. This results in a larger imaging volume which allows for almost full body imaging. In addition, where elongated pole members are employed a full-body scan can be obtained by vertical adjustment of the patient.

Apparatus implemented in accordance with the present invention allow for methods of conducting magnetic resonance imaging comprising providing a static magnetic field directed along a horizontal field axis. The field is suitable for imaging within an imaging volume having a vertical dimension greater than the horizontal dimension of the imaging volume in a direction transverse to the field axis. A patient is disposed within the imaging volume such that the patient's torso is oriented substantially vertically. The static magnetic field is then used to acquire magnetic resonance image data from a portion of the patient's anatomy.

DETAILED DESCRIPTION

Figure 1:
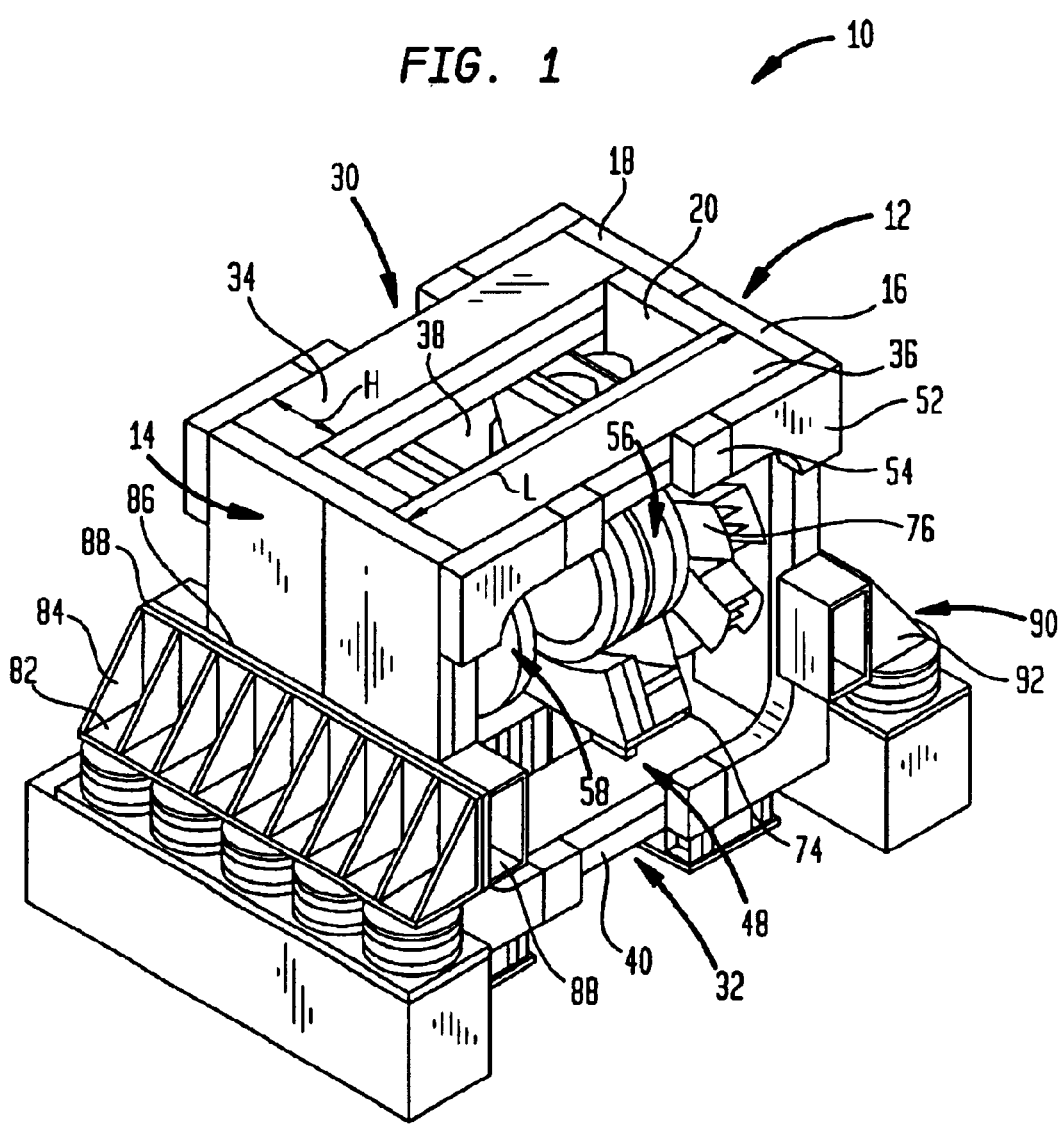
FIG. 1 is a perspective view of a magnet structure in accordance with an embodiment of the invention with certain portions removed for clarity of illustration.
Figure 2:
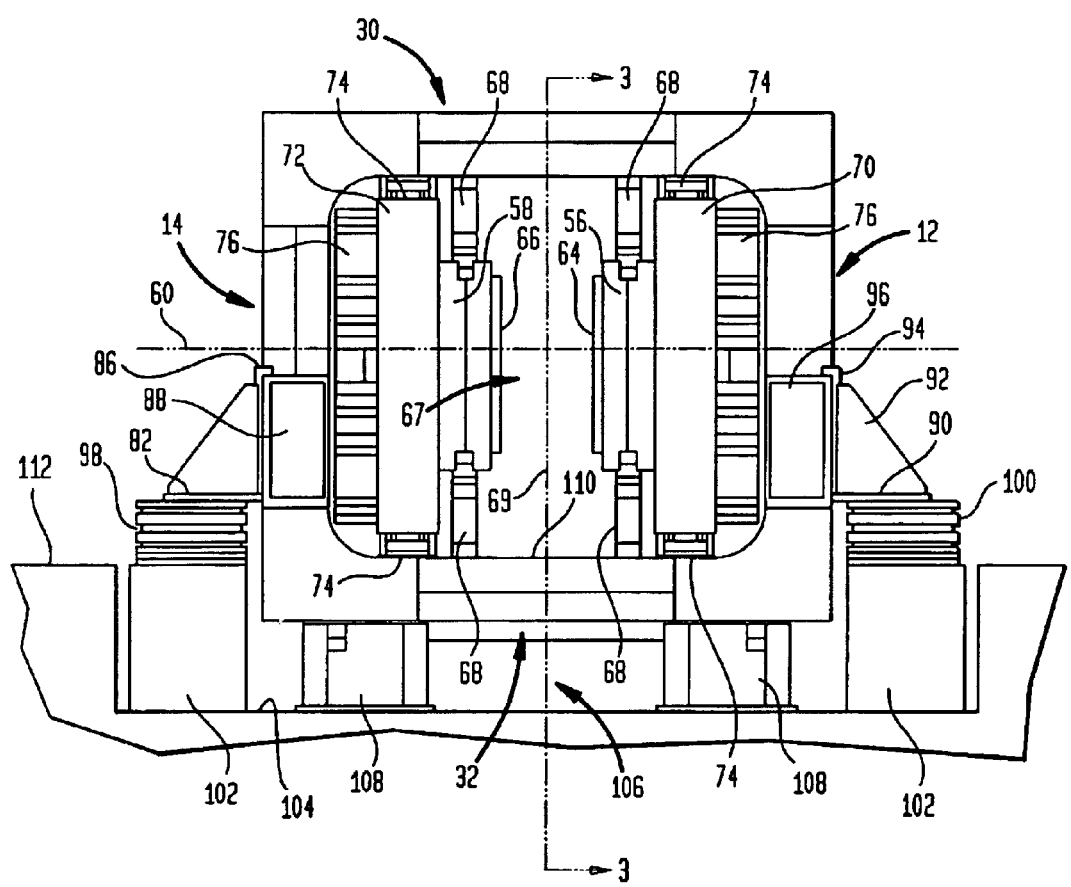
FIG. 2 is a front elevational view of the magnet structure depicted in FIG. 1.
Figure 3:
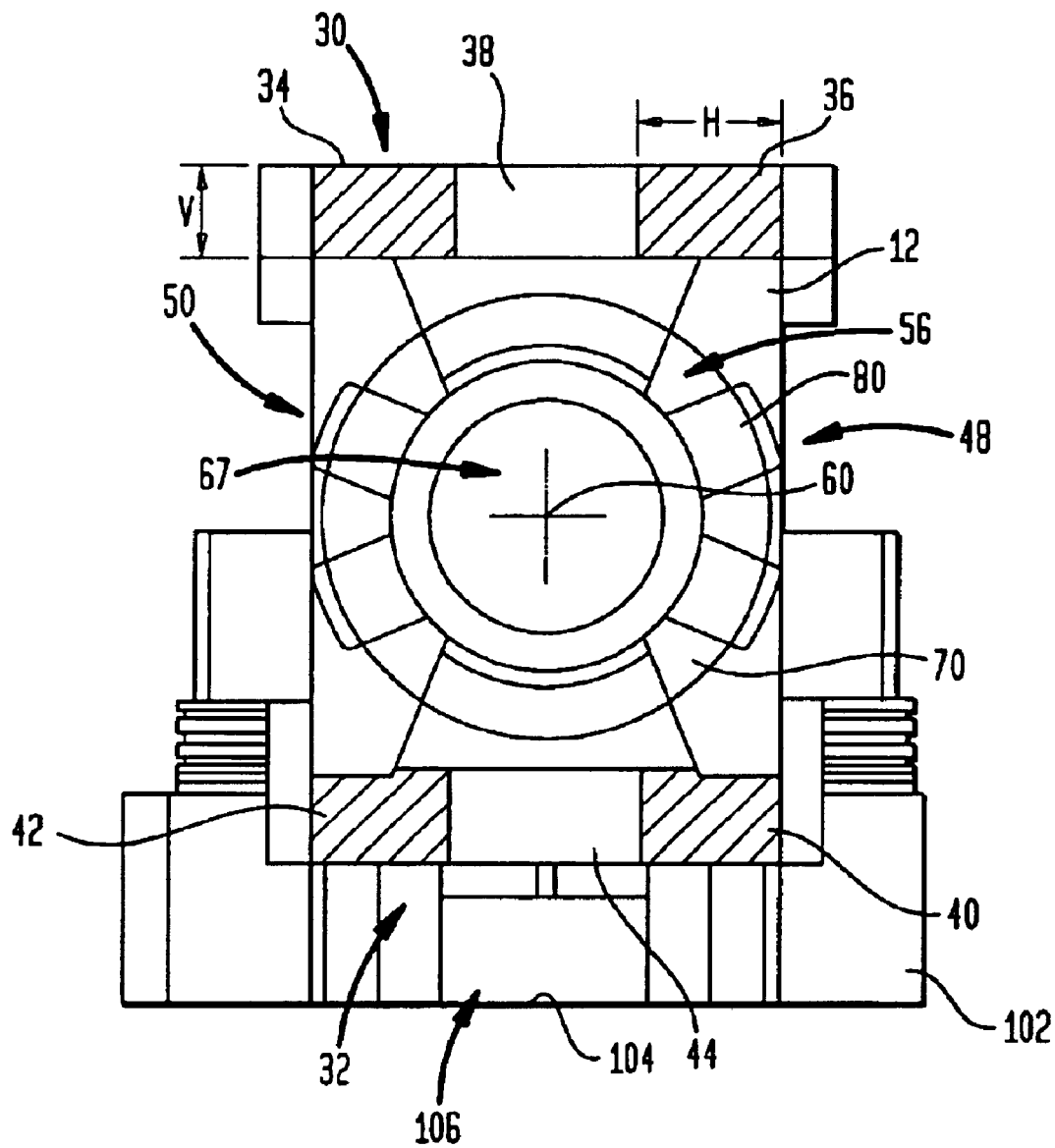
FIG. 3 is a sectional view taken along line 3-3 in FIG. 2.
Figure 4:
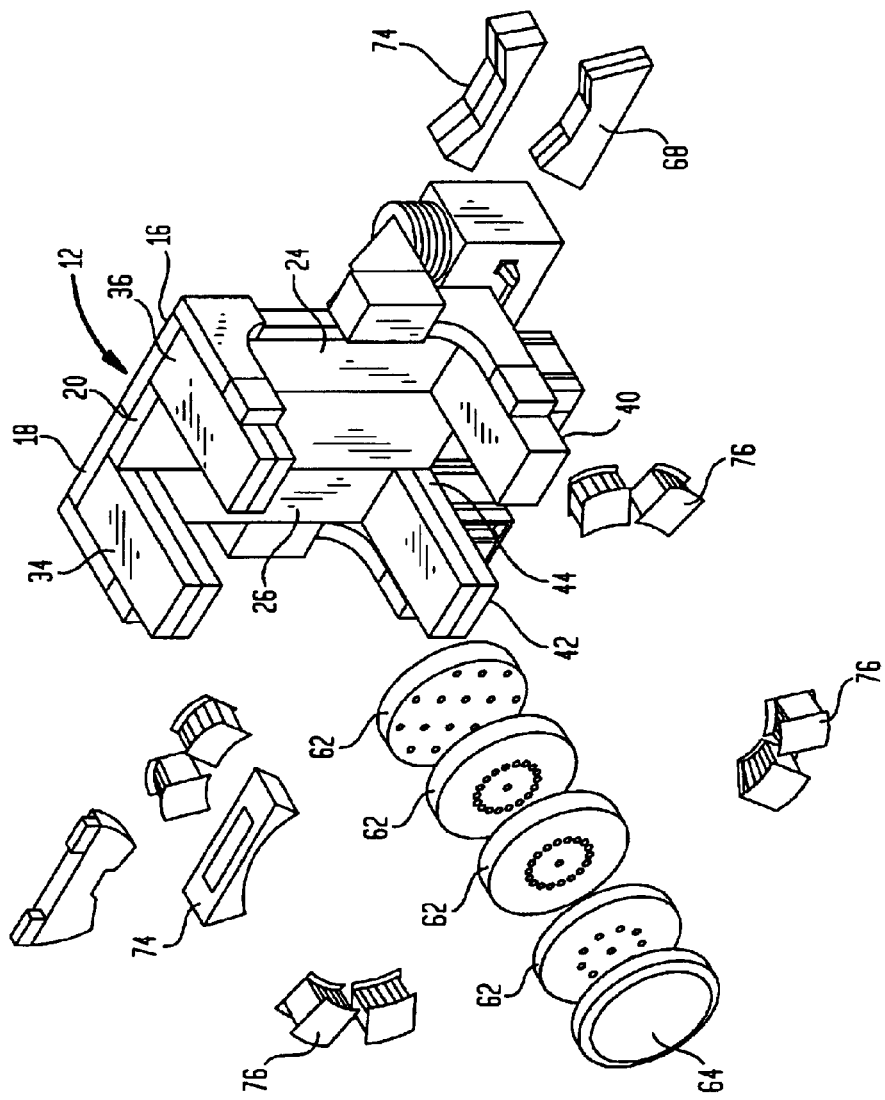
FIG. 4 is a partial exploded view of the structure depicted in FIGS. 1–3.

A magnetic resonance imaging apparatus in accordance with an embodiment of the invention includes a ferromagnetic frame 10 as is shown in FIGS. 1–4. Frame 10 includes a right side wall or pole support plate 12 and a left side wall or pole support plate 14. These side walls extend vertically. As best seen in FIG. 4, first side wall 12 is made up of two layers of ferromagnetic slabs. The outermost layer includes slabs 16 and 18 disposed side by side and extending the full height of the frame. The inner layer includes a further full height slab 20 and a pair of partial height slabs 24 and 26 extending alongside of slab 20. The left side wall 14 has a similar structure.

Frame 10 also includes a top flux return structure 30 and a bottom flux return structure 32 extending between side walls 12 and 14 at the top and bottom thereof. The top flux return structure 30 includes two columns 34 and 36. Each such column is formed from two superposed slabs. The two columns 34 and 36 are spaced apart from one another so that they cooperatively define a top opening 38 in the top flux return member. Columns 34 and 36 lie on opposite sides of the full height slab 20 of the innermost layer in side wall 12 and lie on opposite sides of the corresponding full height slab of wall 14. Columns 34 and 36 rest on the top ends of the partial height slabs 26 and 24 (FIG. 4) and similarly rest on partial height slabs of wall 14. The bottom flux return member 32 includes a similar pair of columns 40 and 42 (FIGS. 3 and 4) defining a similar opening 44 in the bottom flux return member. The side walls and the flux return members thus form a rectilinear box, with the top flux return member 30 constituting the top wall of the box, the bottom flux return member 32 constituting the bottom wall of the box and the side walls 12 and 14 forming the side walls of the box. The box-like frame defines a front patient opening 48 on one side of the frame visible in FIG. 1 and a similar rear patient entry opening 50 on the opposite side of the frame.

In the particular embodiment illustrated, each of the columns 34, 36, 40 and 42 constituting the flux return structures is about 10 feet long (L), about 2 feet wide in the horizontal direction (H) and about 16 inches in the vertical direction (V). Each side wall is almost 11 feet high and about 7 feet wide. The aggregate thickness of each side wall, including both layers of slabs is about 16 inches. The front and rear patient entry openings 48 and 50 are about 8 feet high by 9 feet wide. The top and bottom openings 38 and 40 are about 3 feet wide and 9 feet long and extend through the full span of the flux return structures between the inner faces of the side walls. These dimensions are only exemplary. However, the height of each entry opening, and the vertical clearance between the flux return structures, should be greater than the height of an average person, desirably more than about 7 feet and preferably about 8 feet or more. Also, the top and bottom openings desirably have dimensions sufficient to accommodate at least the head or feet of a patient while the patient is positioned on the patient support. The smallest horizontal dimension of each such opening preferably is at least 18 inches, and more preferably at least about 2 feet.

The frame is provided with ferromagnetic reinforcements 52 at each corner. Additional ferromagnetic plates 54 extend from each reinforcement 52 along the top and bottom flux return structures.

A right side pole 56 extends from the right side wall 12 towards the left side wall 14, and a left pole 58 extends inwardly from left side wall 14 towards left side wall 12.

Poles 56 and 58 are generally cylindrical and are coaxial with one another on a common horizontal polar axis 60. Polar axis 60 is disposed midway between the top and bottom flux return members 30 and 32. As best seen in FIG. 4, pole 56 is formed by a series of stacked ferromagnetic metal disks 62 and a pole cap 64 defining the face of the pole remote from the right side wall. Disks 62 may be formed from the same ferromagnetic material as the remainder of the frame. Pole cap 64 desirably is formed from a material which tends to suppress eddy currents during operation of the apparatus. For example, the pole cap may include a ferrite or other electrically resistive ferromagnetic material or may include sheets or laminae of a ferromagnetic material having low electrical resistivity. Suitable pole face designs for suppressing eddy currents are disclosed, for example, in commonly assigned U.S. Pat. Nos. 5,124,651, 5,592,089 and 5,061,897, the disclosures of which are incorporated by reference herein. Left pole 58 is identical to the right pole and has a similar pole cap defining a left pole face 66 (FIG. 2). In the illustrated embodiment, the pole faces 64 and 66 desirably are about 52 inches in diameter. The pole faces typically are shaped or profiled so as to maximize field uniformity. For example, each pole face may have an axially projecting ridge adjacent it periphery.

Pole cradles 68 are formed from a non-ferromagnetic material and extend vertically between poles 56 and 58 and the flux return members or walls 30 and 32. These pole cradles physically support the ends of the poles remote from side walls 12 and 14.

Poles 56 and 58 are surrounded by electromagnet coil assembly 70 and 72, respectively. In the particular embodiment illustrated these coils are resistive coils. The outer jackets of the poles are depicted; the internal windings are omitted for clarity of illustration. In the illustrated embodiment, each coil assembly carries about 181,200 ampereturns. Coil cradles 74, formed from a non-ferromagnetic material extend between the outer jackets of the coils and the flux return members 30 and 32. Coil pedestals 76, also formed from a non-ferromagnetic material, are provided between coil 70 and right side wall 12 and between coil 72 and left side wall 14. The coils are omitted in FIG. 1 for clarity of illustration. The coils are retained on the coil pedestals by non-ferromagnetic coil support plates 80 (FIG. 3) on the side of each coil remote from the coil support plates. The pedestals function to optimize the field homogeneity and enhance efficiency.

The ferromagnetic elements of the frame desirably are formed from low-carbon steel such as 1001 or 1006 steel. The non-ferromagnetic elements desirably are formed from aluminum.

The polar axis 60 is aligned with the openings 38 and 44 in the top and bottom flux return members (FIG. 3). The pole faces 64 and 66 confront one another and cooperatively define a patient-receiving space 67 between them. The patient-receiving space encompasses the vertical medial plane 69 of the frame, midway between the side walls 12 and 14, and is centered on polar axis 60.

A left side bracket 82 extends along the outer face of left side wall 84. The left side bracket is a generally L-shaped member with a vertical portion abutting the side wall and a horizontal portion projecting outwardly from the side wall. Angle braces 84 are provided within the L-shaped member. The upper edge of the L-shaped left bracket 84 is engaged with a solid key 86 which in turn is engaged in a slot in the left side wall 14. A pair of box-like members, referred to herein as "anti-twist members" 88 project forwardly and rearwardly from the left side wall. These anti-twist members are attached to the edge face of the left side wall and to the left gusset 82. The right side wall is provided with a similar arrangement including a right bracket 90, triangular bracing 92 within the right bracket and a key 94 engaged between the top edge of the right bracket 90 and the right side wall 12. Box-like anti-twist members 96 are also provided on the edges of the right side wall.

In installations where vibrations are of concern, the magnet structure may further include a left side set of vibration isolators 98 disposed beneath the left side bracket 82 and a right side set of vibration isolators 100 disposed beneath the right side bracket 90. The vibration isolators include flexible structure capable of supporting the weight of the frame. In the particular embodiment illustrated, each vibration isolator includes a stack of inflatable bladders. The vibration isolators are supported by a foundation 102, which includes a pair of spaced-apart blocks resting on an underlying base surface 104. The foundation projects upwardly from the base structure so that the foundation and the vibration isolators maintain the frame above the base surface and maintain the bottom flux return structure 32 above the base surface 104. Thus, there is a space 106 beneath the bottom flux return member in alignment with the opening 44 (FIG. 3) in the bottom flux return member. Four support blocks 108 are positioned on the base surface 104. In the normal operating condition of the apparatus, the tops of the support blocks 108 are lie below the bottom surface of the bottom flux return member. These blocks 108 are arranged to support the lower flux return member 32 and the hence to support the entire frame during construction and during servicing of the vibration isolators 100 and 98.

Figure 5:
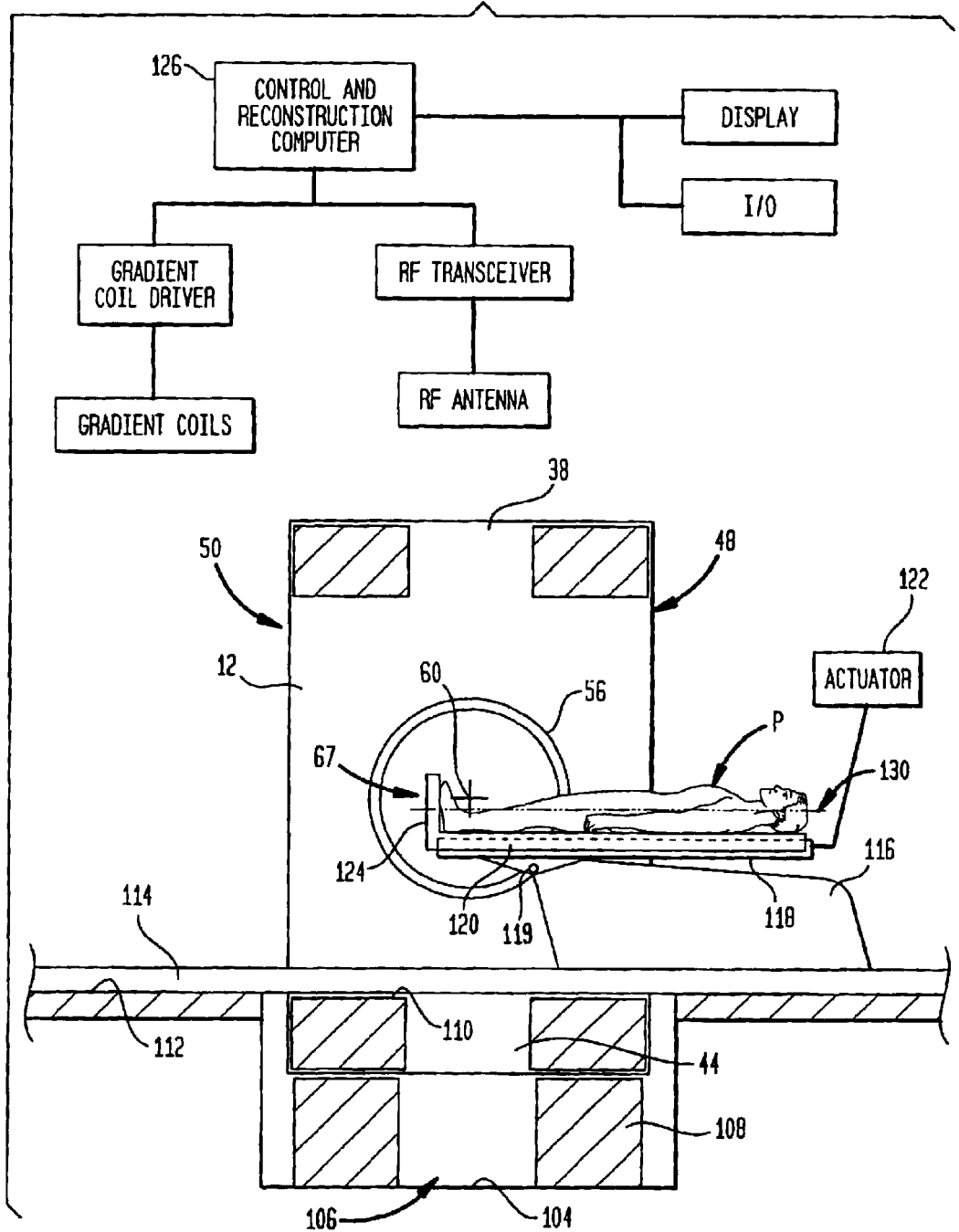
FIG. 5 is a diagrammatic sectional view of the structure shown in FIGS. 1–4 in conjunction with additional apparatus elements and a patient.

Lower flux return member 32 defines an upwardly facing floor surface 110. The building in which the apparatus is employed defines a floor surface 112 (FIGS. 2 and 5) at about the same height as floor surface 110. As best seen in FIG. 5, a simplified cross-sectional view of the apparatus, the floor surface 112 of the building is adjacent to the floor surface 110 at the patient entry openings 48 and 50 so as to form a substantially continuous, level floor. A set of rails 114 extends through the patient entry opening 48 in the front of the apparatus and through patient entry opening 50 at the rear of the apparatus. Rails extend across the floor surface 110 defined by the lower flux return member and across the floor surface 112 defined by the surrounding building structure. A carriage 116 is mounted on the rails so that the carriage can be moved along the rails, into and out of the frame through either patient entry opening.

A patient support assembly including an elevator having an elongated elevator frame 118 and a patient support 120 is also provided. The patient support is slideable along the elevator frame (to the left and right as seen in FIG. 5). An actuator 122, schematically indicated in FIG. 5, is connected between the elevator frame 118 and the patient support 120. The actuator may include essentially any device capable of moving the patient support relative to the frame as, for example, pneumatic cylinders and hydraulic cylinders, and screws, cables or other motion-transmitting elements linked to electric or fluid driven motors. Where electric motors are employed, the same may be electrically and magnetically shielded. Also, those elements of the patient support assembly, including the patient support 120, elevator 120 and actuator 122, which will be positioned in the patient receiving space of the apparatus during actual MRI scanning operations, desirably are formed from non-magnetic materials. Where actuator 122 includes one or more electric motors or other elements which have ferromagnetic components, these elements can be positioned on a part of carriage 116 which is disposed outside of the patient-receiving space during use of the apparatus.

Patient support 120 preferably has a foot rest 124 at a lower end of the support. The patient support may also include conventional devices such as straps and cushions for retaining the patient in position on the support and for providing patient comfort during the procedure. Elevator frame 118 is mounted to the carriage 116 for pivoting movement about a pivot axis 119. Pivot axis 119 extends horizontally and hence is parallel to the polar axis 60. The carriage may further include devices (not shown) for raising or lowering pivot axis 119 and hence raising and lowering the elevator frame 118 and patient support 110 relative to the carriage.

The apparatus is used in conjunction with a control and reconstruction computer 126 linked to a display apparatus and input/output or "I/O" devices for actuating the computer as is schematically illustrated in FIG. 5. The control and reconstruction computer 126 is also linked to a set of gradient coils through a gradient coil driver adapted to supply appropriate currents to the gradient coils responsive to commands from the control and reconstruction computer. The control and reconstruction computer is also linked to a radio frequency transceiver which in turn is connected to one or more RF antennas. These elements of the apparatus may be entirely conventional. In the normal manner, the gradient coils are disposed within the apparatus. Typically, the gradient coils are mounted in proximity to the faces of the poles. The RF antenna may be mounted on the magnet frame; mounted on the patient support structure or even attached to the patient.

In an imaging method according to one embodiment of the invention, a patient P is positioned on patient support 120 in a generally horizontal position, i.e. with the patient's axis of elongation or head to toe axis 130 horizontal. For example, the patient may be prone or supine or may be lying on his or her side. The patient may be positioned on the patient support while the carriage 116 is outside of frame 10. Thus, the carriage 116 may be moved to a retracted position remote from the magnet frame and the patient may be loaded onto the magnet frame while the carriage is in this remote position. The patient may also walk into the patient receiving space and be positioned on the patient support with carriage inside the frame 10. The patient may be imaged in this horizontal position. Any portion of the patient may be aligned with the polar axis 60 by moving the carriage along the rails, by actuating the elevator to move the patient support relative to frame 118, or both.

Figure 6:
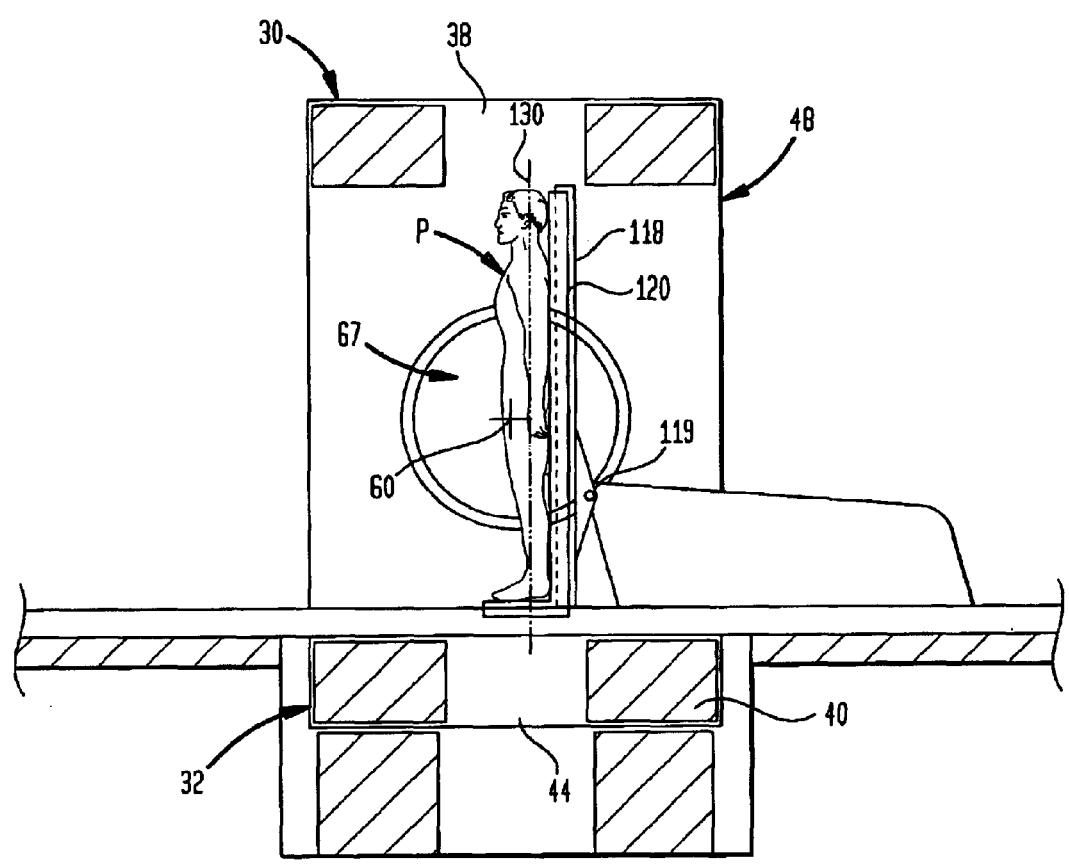
FIGS. 6, 7 and 8 are views similar to FIG. 5 but depicting the apparatus during other phases of operation.
Figure 7:
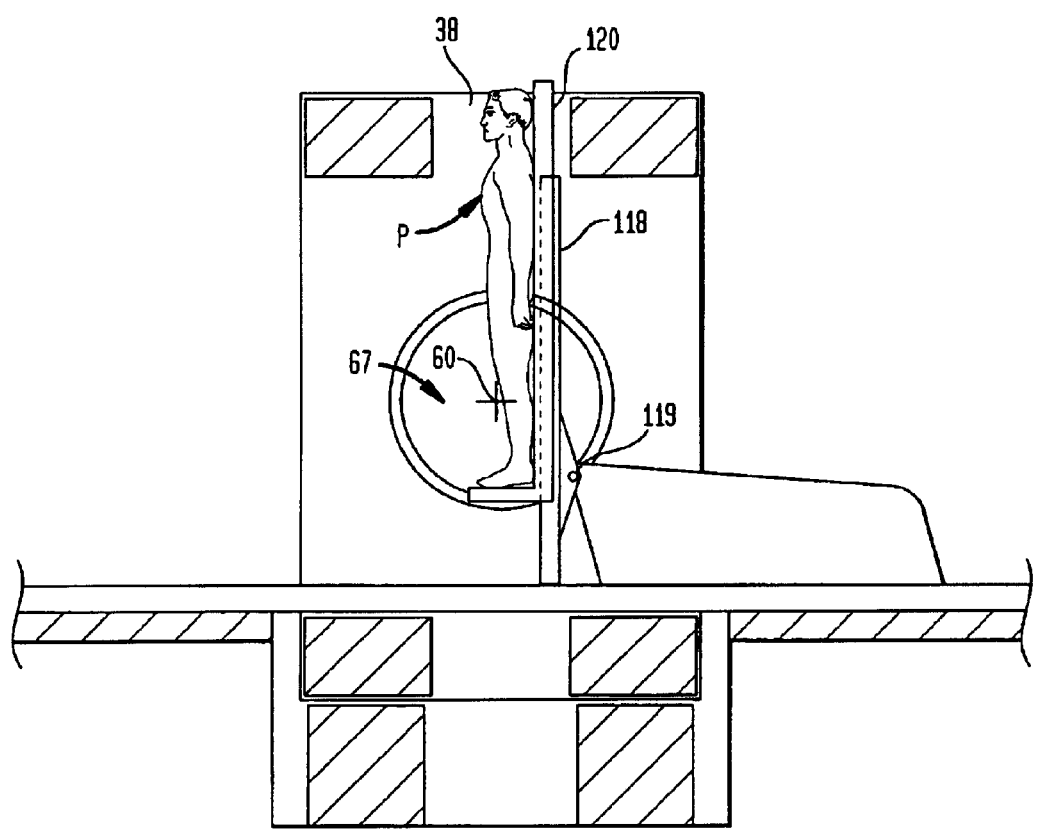

Alternatively, as shown in FIG. 6, the elevator 118 and patient support 120 may be pivoted about pivot axis 119 so as to move the patient to a standing position with the long axis 130 of the patient substantially vertical. In this condition, the patient support 120 and the patient P are positioned within the top opening 38 in the top flux return structure 30 and the bottom opening 40 in the bottom flux return structure. A portion of the patient is disposed in the patient-receiving space 67 between the poles of the magnet frame. In the particular condition illustrated in FIG. 6, the lower torso of the patient is aligned with the polar axis 60, and parts of the body including the lower torso can be imaged. However, the patient support 120 can be moved by the actuator 122 (FIG. 5) relative to the elevator frame 118 so as to move the patient vertically and bring any desired portion of the patient into aligned with the polar axis 60. For example, as seen in FIG. 7, the patient support has been raised to a position in which a part of the patient support 120 and the patient's head protrude upwardly into the top opening 38. In this condition, the patient's legs are disposed within the patient receiving space, near the polar axis 60. This allows imaging of the legs while the patient remains in a standing condition.

Figure 8:
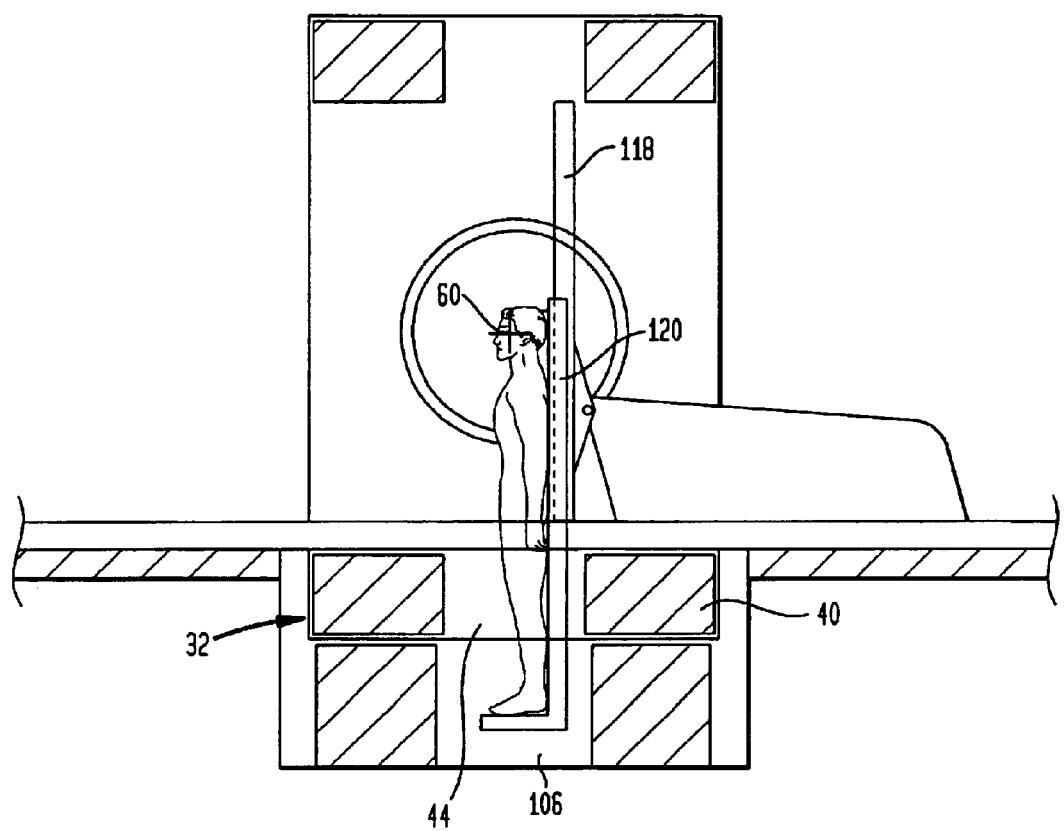

Patient support 120 can be lowered relative to the elevator frame and hence relative to the magnet frame to the position shown in FIG. 8 in which a portion of the patient support and the patient's feet protrude into the lower opening 40 in the bottom flux return structure and also protrude below the flux return structure into the space 106 beneath the bottom flux return structure. In this condition, the patient's head is aligned with the polar axis of the apparatus.

The apparatus thus allows imaging of essentially any part of the patient's body while the patient is in a standing position, with his long axis vertical or while the patient is in a horizontal position. The apparatus discussed above also can image a patient while the patient is in an intermediate position between horizontal and vertical orientations. For example, by tilting the patient support 120 and elevator frame 118 to a position intermediate between the position depicted in FIG. 5 and the position depicted in FIG. 6, the patient can be placed into a reverse Trendlenberg position, with his head elevated slightly relative to his feet and with his long axis 130 at an oblique angle to the horizontal and vertical directions. If the patient is initially positioned on the support with his head adjacent foot rest 124, a similar pivoting motion will place the patient into a conventional Trendlenberg position, with his head depressed relative to his feet. With the other frame and patient support in this oblique position, the actuator 122 (FIG. 5) can be used to move the patient support along the elevator frame and thus align different portions of the patient's body with the patient receiving space 67 and polar axis 60. Carriage 116 can be moved along rails 114 in conjunction with movement of the patient support 120 on frame 118. Thus, essentially any portion of the subject's body can be placed within the patient receiving space 67, in alignment with the poles and imaged while the patient is in essentially any position.

The ability to image patients in different positions is particularly helpful where orientation of the body will influence the structure or function of the body part to be imaged. For example, an image of a skeletal structure can be captured while the structure is bearing the patient's normal weight in a standing posture. Also, as described in greater detail in U.S. provisional patent application 60/167,395 filed Nov. 24, 1999, the disclosure of which is hereby incorporated by reference herein, the dynamics of fluid flow in the body also vary with position of the patient. An image of the fluid containing structures of the body, as, for example, an angiogram of the coronary arteries captured while the patient is in an erect position as, for example, standing will provide additional information, beyond that which can be obtained from a similar image captured while the patient is supine. Apparatus and methods according to the present invention can be utilized in capturing angiograms, images of structures containing the cerebral spinal fluid and other images of fluid containing structures in the body.

The functions discussed above are provided in a magnet frame which has inherently good magnetic field uniformity. Moreover, the magnet can be erected in the field at reasonable cost, and provides a highly non-claustrophobic experience for the patient. To facilitate the fabrication of the magnet, some parts of the magnet frame depicted as solid elements herein can be formed as a series of sheets which can be stacked and bolted or otherwise connected together in the field. The use of laminates in a magnet frame is discussed in greater detail in the copending, commonly assigned United States provisional patent application entitled "MRI Magnet Frame With Laminated Carbon Steel," filed on or about Nov. 21, 2000 and naming Luciano B. Bonnani as an inventor, the disclosure of which is hereby incorporated by reference herein.

Figure 9:
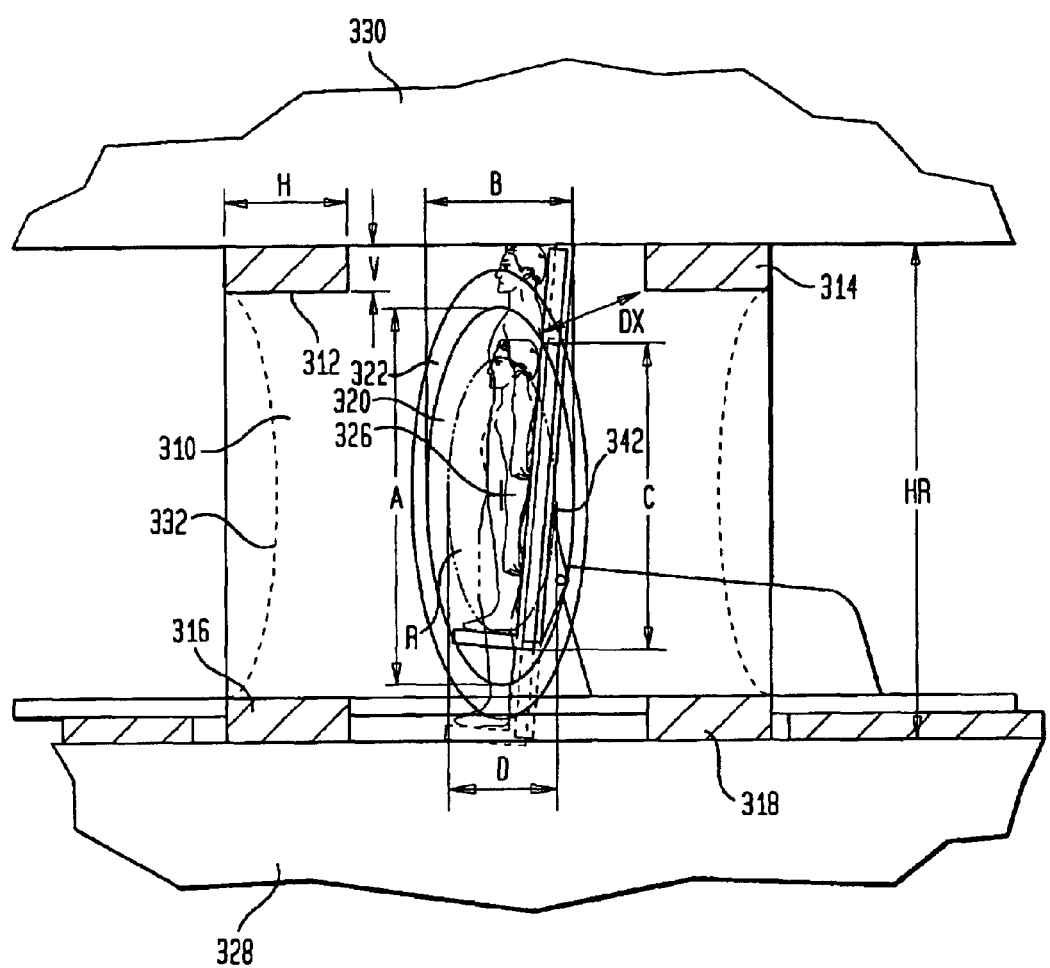
FIG. 9 is an illustrative side view of a magnet in accordance with another embodiment of the present invention.
Figure 10:
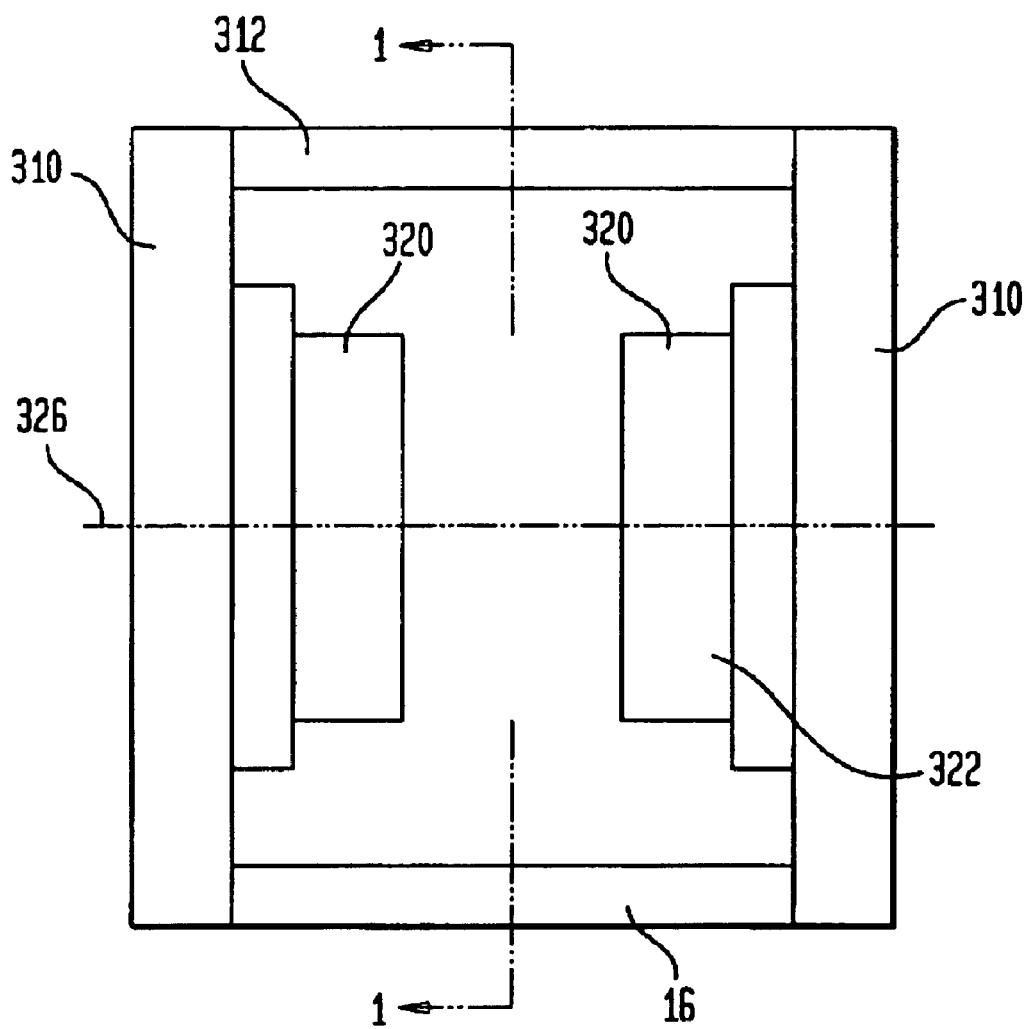
FIG. 10 is a schematic front view of a magnet in accordance with the present invention.

An aspect of the invention incorporates the realization that the required range of motion can be reduced by incorporating elongated, preferably elliptical, poles in a magnet having a horizontal pole axis. A magnetic resonance imaging apparatus according to an embodiment of the present invention includes a ferromagnetic frame incorporating a pair of vertically extending side walls 310 (FIGS. 9 and 10). An upper flux return structure including a pair of flux return members 312 and 314 extends from one side wall 310 to the opposite side wall. These upper flux return members are disposed adjacent the top of the side walls. Each of the upper flux return members preferably has a vertical dimension V substantially smaller than its horizontal dimension H. Desirably, the ratio of the horizontal dimension to the vertical dimension V is at least about 1.5:1, more desirably at least about 2:1, and most preferably on the order of 4:1, 5:1 or more. A lower flux return structure includes a pair of lower flux return members 316 and 318, similar to the upper flux return members. The lower flux return members also extend between the side walls 310. A pair of poles 320 project inwardly from side walls 310 into the space between the side walls so that the poles define a patient receiving space between them. The poles define a pole axis 326 extending in the lateral direction, between the side walls near the middle of the poles. As best seen in FIG. 9, poles 320 are elongated in the vertical direction so that each pole has a vertical dimension A greater than the horizontal dimension B of such pole in the direction parallel to the end or face of the pole, i.e., parallel to the side walls 310 and parallel to the medial plane of the patient receiving space. Preferably, each pole as seen in end view (FIG. 9) is in the form of an ellipse, a rounded rectangle or other shape devoid of sharp edges parallel to the pole axis. A source of magnetic flux such as a permanent magnet material, a superconducting electromagnet coil, or a resistive electromagnet coil 322 is associated with the magnetic frame. Preferably, the poles are aligned so that the pole axis 326 lies approximately midway between the top and bottom of the side walls and also midway between the vertical edges of the side walls. This arrangement provides an imaging region or volume R about pole axis 326 between the faces of the poles. The flux within this region is of acceptable quality for imaging. The imaging region is also elongated; it has a vertical dimension C larger than its horizontal dimension D. Preferably, the vertical dimension of the imaging volume C is at least about two feet, and preferably about three feet. The horizontal dimension D should be large enough to accommodate the horizontal dimensions of a normal human adult as, for example, about 16 inches or more. The enlarged vertical extent of the imaging volume minimizes the amount of vertical movement needed to bring any portion of a standing patient within the imaging volume. For example, in the position illustrated in solid lines in FIG. 9, the lower portion of the patient's torso and the patient's legs are disposed within the imaging volume R and hence can be imaged. A downward displacement of about three feet from this position, to the position indicated in broken lines in FIG. 9 will suffice to bring the patient's head entirely within the imaging volume. Thus, the entire apparatus, including clearances needed for vertical movement of a standing patient and imaging of the patient from his head to his toes, can be accommodated in a total vertical clearance or head room HR between building structures 28 and 30 of about nine feet or less. Stated another way, the total vertical clearance (TVC) required for head-to-toe imaging is given by $$TVC = 2HT - C, \text{ where}$$

HT is the height of the patient in an erect posture; and
C is the vertical dimension of the imaging volume.

The relatively small vertical dimensions V of the flux return members 312–318 helps to keep the flux return members at a substantial distance DX from the poles and tends to minimize flux leakage. Moreover, the small vertical dimensions of the flux return members provide a relatively large vertical clearance between the top and bottom flux return members for entry and exit of the patient and for access by medical personnel. The flux return members must provide sufficient cross-sectional area to carry the flux at a reasonable flux density. Stated another way, as the vertical dimensions V of the flux return members are reduced, the horizontal dimensions H of these members must be increased so as to provide the requisite cross-sectional area. However, this does not present a serious problem because an increase in the horizontal dimensions H of the flux return members can be accommodated by extending these members in horizontal directions away from the pole axis. This does not significantly impede access to the patient receiving space. The required cross-sectional area of the flux return members will vary with the amount of flux which the frame must carry to provide the required field strength in the unit. For example, for a unit having a field strength of about six kilogauss, the flux return members desirably have a cross-sectional area of about 400 square inches. In one exemplary embodiment, the flux return members have vertical dimensions V of about 8½inches and horizontal dimensions H of about 45 inches.

To further increase the distance DX between the poles and the flux return members, the top flux return members 312 and 314 may be widely spaced from one another and the bottom flux return members 316 and 318 also may be widely spaced from one another. Although this further increases the required horizontal dimensions of the side walls, such increased dimensions may be accommodated without significant effects on patient access or field quality. To conserve materials, portions of the side walls adjacent to the vertical midpoint of the side walls and remote from the poles can be omitted so as to provide the vertical edges of the side walls with an inwardly scalloped shape as indicated in broken lines at 332 in FIG. 9.

The magnet most preferably is used in combination with a patient supporting structure 342 capable of supporting a patient in a posture such that the long axis of the patient, or at least the patient's torso, is generally vertical. The supporting structure desirably is capable of moving the patient vertically. As discussed in greater detail in the '490 patent, such a supporting structure may also be capable of tilting the patient around a horizontal axis parallel to pole axis 26 and may include an elongated patient support such that the patient can lie or rest on the patient support, as well as a foot rest projecting from the bottom of the support for supporting the patient in a standing posture.

In an imaging method according to a further aspect of the invention, patient support is initially positioned in the fully depressed position shown in broken lines in FIG. 9. The patient can enter the magnet as, for example, by walking across the floor or lower building structure 328 and over the lower flux return member 316. The low height of the flux return member further facilitates patient entry. Moreover, in the fully depressed position, the support holds a typical patient so that his head is approximately at the top of the imaging volume and his neck and torso are within the imaging volume. The patient can be imaged in this position and then the patient support can be elevated progressively to raise it to the fully elevated position seen in solid lines in FIG. 9, wherein the patient's feet are at the lower end of the imaging volume and his lower body and legs are within the imaging volume. The patient support can be stopped at any intermediate position and images can be acquired at any intermediate position. Thus, the entire patient can be imaged in a single series of positions in a single upward movement of the support. Alternatively, the patient support can be raised to the fully elevated position, and the entire patient can be imaged in a single downward movement cycle. In yet another alternative, the patient can be imaged at one or more intermediate positions in the upward cycle and at one or more intermediate positions in the downward movement. However, in all of these variants, a whole body image including the head and feet can be acquired in a single cycle of upward and downward movement, commencing at the fully depressed or boarding position shown in broken lines in FIG. 9 at ending at the same position. In a further variant, where a whole body image is not needed, the patient can be brought to an appropriate position and imaged. Even where a whole body image is not needed, the vertically elongated poles and vertically elongated imaging region allow imaging of a relatively large portion of the patient's anatomy. For example, an image of the torso and neck can be acquired in a single patient position.

These capabilities materially enhance patient throughput in numerous applications. In particular, these capabilities facilitate use of the MRI system in a whole body scanning procedure of the type contemplated in U.S. Pat. No. 4,770, 182, the disclosure of which is hereby incorporated by reference herein. As disclosed in the '182 patent, the whole body imaging procedure is particularly valuable in screening methods which can be used for "normal" patients who do not have symptoms indicative of a specific disease or illness, or who are not suspected of being ill at all. In yet another variant, the patient support 342 can be provided with a seat for holding the patient in a sitting posture. As used in this disclosure, the term "erect posture" refers to a patient posture in which the patient's spine is substantially vertical as, for example, a standing posture or a sitting posture. Where the patient is disposed in a sitting posture, substantially the entire torso and neck can be imaged in a single position of the patient support.

Figure 11:
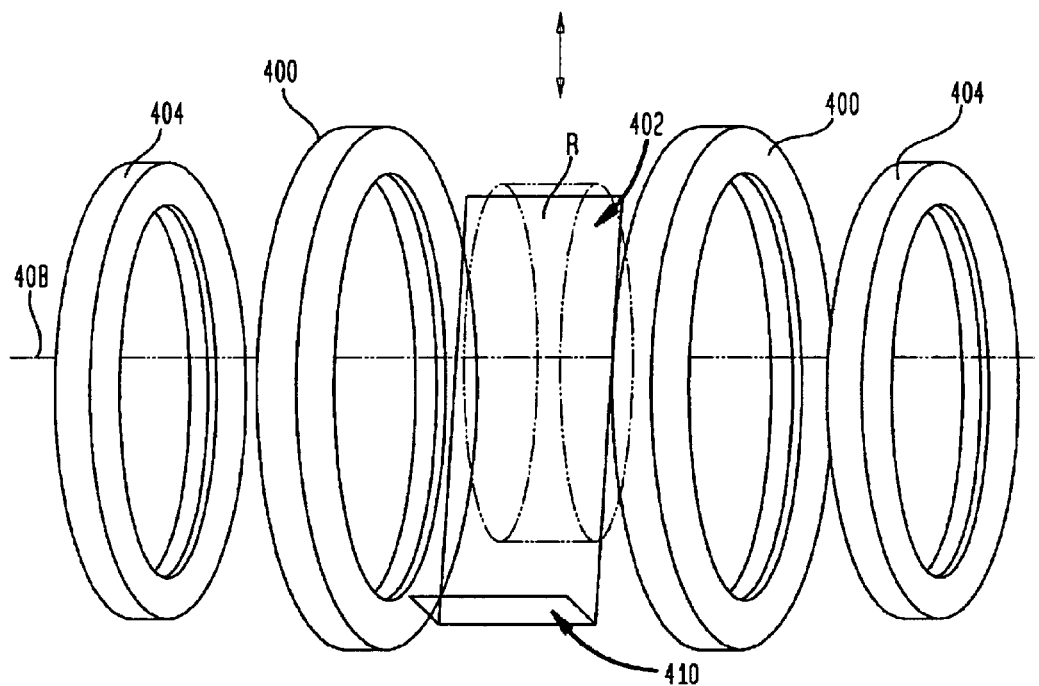
FIG. 11 is a schematic of additional embodiments of a magnet in accordance with the principles of the present invention.

As best seen in FIG. 11, other types of magnets having vertically elongated imaging volumes can be employed in conjunction with a vertically moveable patient rest. Thus, certain magnets can include a set of superconducting main field coils 400 held in spaced-apart relationship to one another so as to provide a patient receiving space 402 between them. Auxiliary or "bucking" coils 404 may be provided in association with the main field coils 400. In lieu of auxiliary coils 404 a heavily shielded room may be used to limit the reach of the fringe field. The coils are arrayed along a horizontal coil axis 408. In known manner, the numbers of turns in coils 400 and 404, the sense of the current flowing within such turns and the magnitude of such currents are selected so as to provide a substantially uniform field directed along the coil axis 408 within an imaging region or inside the patient receiving space 402 and to suppress "fringe" fields outside of the patient receiving space. Such a magnet typically does not incorporate a ferromagnetic frame or physical poles. In particular, such a magnet may include a structure capable of holding the field coils in place.

In this embodiment, the coils are elliptical rather than circular and are elongated in the vertical direction (upwardly and downwardly in the drawing as seen in FIG. 11) so as to provide a similar vertically elongated imaging region R similar to that as discussed above. In the embodiment discussed above with reference to FIGS. 9 and 10, the field vector is directed parallel to axis 326, and the field surrounds such axis. Similarly, in the embodiment of FIG. 11, the field vector is directed parallel to coil axis 408, and the field surrounds that axis. The term "field axis" as used herein refers generally to an axis such that the field vector is parallel to the axis, and the field surrounds the axis. Here again, when used in association with a vertically movable patient support 410 similar to that discussed above, the vertically elongated imaging region limits the amount of travel over the patient support required and hence limits the head room required for the apparatus.

Although in a preferred embodiment the magnetic field volume is elliptical in shape, the present invention is not limited to elliptically shaped elements or field coils 400. That is, magnets of this type may also include round or cylindrical elements in conjunction with the vertically movable patient support 410. As a general matter, these magnets are capable of allowing a patient to walk into the patient receiving space and be imaged in an upright orientation. In addition, once a patient is positioned on the patient support 410 the patient may be rotated about the horizontal coil axis 408 and/or raised and lowered by an elevator, as is discussed above, and also imaged.

Figure 12:
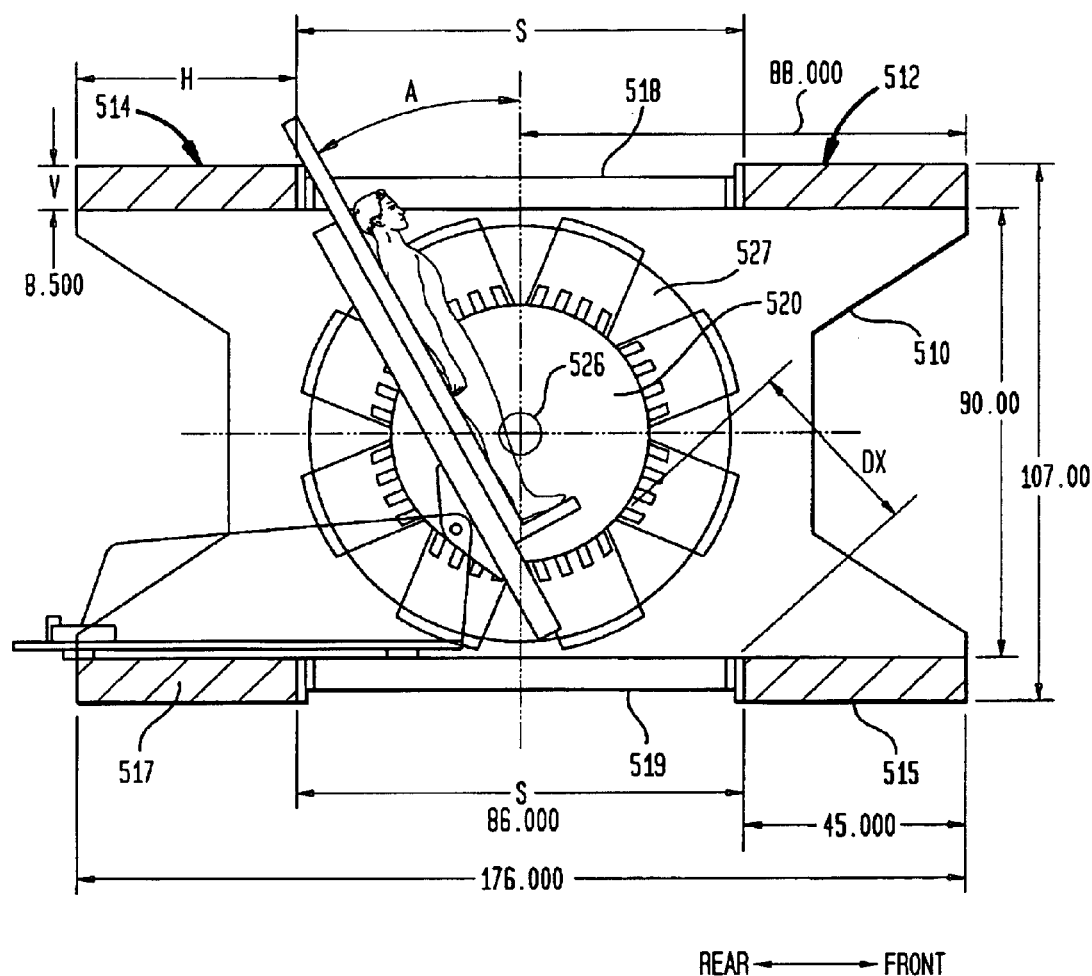
FIGS. 12 and 13 depict side and front views of an additional embodiment of a magnet in accordance with the principles of the present invention.
Figure 13:
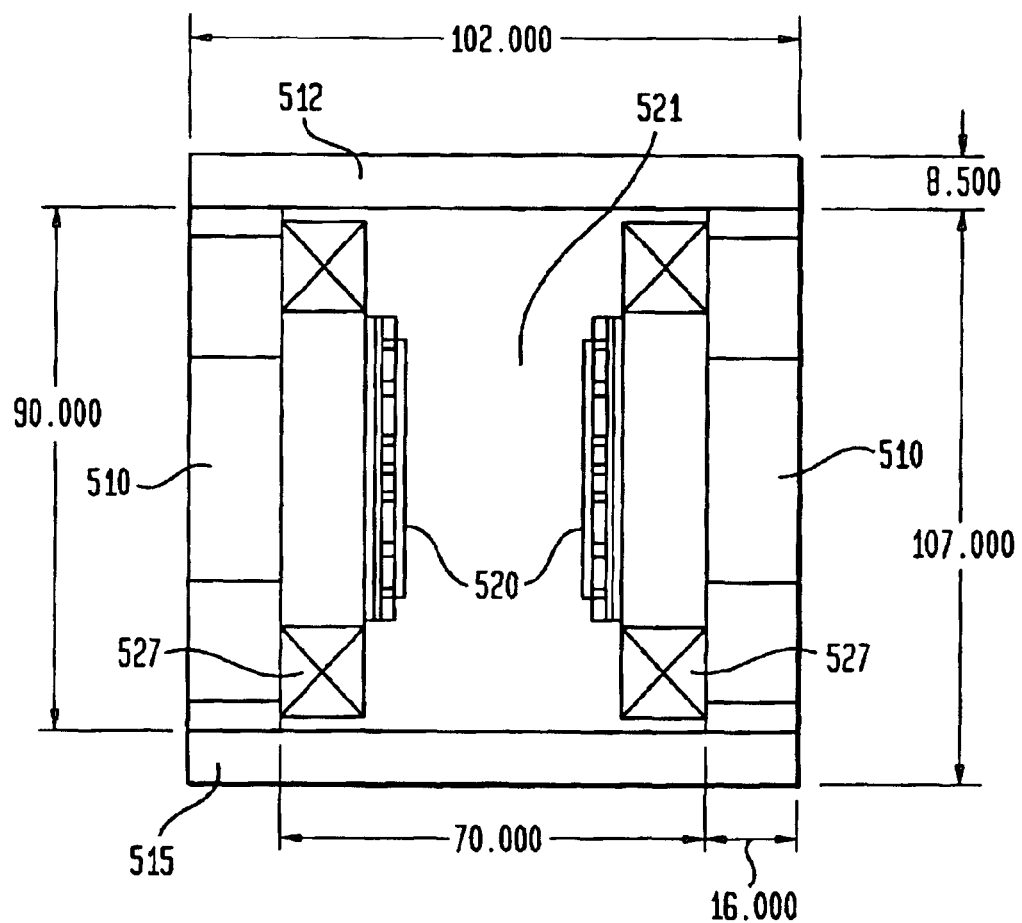

In addition to the elliptical poles shown in FIG. 9, structures using the low height, widely-spaced cross members also can be used in conjunction with round (cylindrical) poles of the type shown in the '946 application. As seen in present FIGS. 12 and 13, a magnet structure according to one embodiment of the invention includes a pair of vertically extending sidewalls 510 and a upper flux return structure including a pair of flux return members 512 and 514 extending between sidewalls 510. Each of these flux return members has a vertical dimension V substantially smaller than its horizontal dimension. The ratio of the horizontal dimension H to the vertical dimension V is at least about 1.5:1, more preferably at least about 2:1, and most preferably on the order of 4:1, 5:1 or more. The most preferred dimensions for the flux return members (and other structures of the magnet) are shown in FIGS. 12 and 13; all of these dimensions are in inches. The lower flux return structure includes a similar pair of flux return members 215 and 217.

As also shown in FIG. 12, the upper flux return members 512 and 514 are widely spaced from one another in the front-to-rear horizontal dimension of the magnet indicated by the labeled arrow. Desirably, the spacing S is on the order of six feet (72 inches or more), but larger spacing distances S are even more preferred as, for example, at least about 80 inches and most preferably about 86 inches or more. The spaced-apart flux return members 512 and 514 of the upper flux return structures define a large aperture 518; whereas the flux return members 515 and 517 define a similar large aperture 519 in the lower flux return structure.

A pair of round, generally cylindrical ferromagnetic poles 510 project inwardly from the opposed sidewalls 520 along a magnet axis or pole axis 526. Pole axis 526 is aligned, in the front-to-rear direction with the centers of apertures 518 and 519 and define a patient-receiving space or gap 521 (FIG. 13) between them. A flux source is also provided; in the arrangement depicted, the flux source includes coils 227, which may be resistive or super-conducting coils surrounding the poles or may be permanent magnet material.

As best appreciated with reference to FIG. 12, the large apertures 518 and 519, and in particular the large spacing dimension S between flux return members, allows essentially unlimited elevation or depression of the patient even where the patient or the patient support is disposed at a substantial angle A to the vertical direction. To accommodate maximum patient movement, the ferromagnetic frame may be mounted in a structure such as a building which provides clearances above and below apertures 518 and 519. Also, the large space between flux return members places the flux return members at a large distance from the pole axis 526 and, hence, provides a large distance DX from the periphery of pole 520 to the nearest edge of each flux return member. This minimizes flux leakage from the poles to the flux return members and promotes field uniformity in the patient-receiving space. Thus, the diameters of the poles need not be limited to minimize flux leakage.

In a further variant, the upper and lower flux return members may not necessarily include pairs as is described hereinabove. In particular the upper and lower flux return members may include a single member that positioned and sized to provide an adequate flux return path. In particular an apparatus may be constructed that includes only an upper flux return member at the front of the apparatus, e.g., block 312 in FIG. 9, and either one of the lower flux members, e.g., either one of blocks 316 and 318 in FIG. 9.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A magnetic resonance imaging apparatus comprising:
   a frame including a pair of sidewalls extending in a vertical direction,
   a pair of elements projecting from said sidewalls and spaced apart from each other along a horizontal pole axis and defining a patient-receiving space between said elements, and
   upper and lower flux return members extending between said sidewalls, said flux return members each having a width dimension extending substantially transverse to the direction of said sidewalls and said horizontal pole axis and a vertical dimension extending substantially parallel to the direction of said sidewalls, said vertical dimension being substantially smaller than the width dimension.

2. The apparatus of claim 1 wherein the ratio of said width dimension to said vertical dimension is at least 1.5:1.

3. The apparatus of claim 1 wherein the ratio of said width dimension to said vertical dimension is 2:1.

4. The apparatus of claim 1 wherein the ratio of said width dimension to said vertical dimension is 4:1.

5. The apparatus of claim 1 wherein the ratio of said width dimension to said vertical dimension is 5:1.

6. The apparatus of claim 1 wherein said upper flux return members are spaced apart form each other in a direction substantially transverse to said horizontal pole axis so as to define an opening of at least 80 inches.

7. The apparatus of claim 1 wherein said upper flux return members are spaced apart from each other in a direction substantially transverse to said horizontal pole axis so as to define an opening of 86 inches.

8. The apparatus of claim 1 wherein said lower flux return members are spaced apart from each other in a direction substantially transverse to said horizontal pole axis so as to define an opening of 86 inches.

9. The apparatus of claim 1 wherein said upper and lower flux return members are each respectively spaced apart from each other in a direction substantially transverse to said horizontal pole axis so as to define an opening of at least 80 inches.

10. The apparatus of claim 1 wherein said pair of elements each comprise a substantially circular magnet pole.

11. The apparatus of claim 1 wherein said pair of elements define an imaging volume having a vertical dimension in a direction parallel to the direction of said sidewalls and a horizontal dimension in a direction parallel to said horizontal pole axis such that said vertical dimension is larger than said horizontal dimension.

12. The apparatus of claim 1 wherein said pair of elements each comprise a substantially elliptical magnet pole.

13. The apparatus of claim 12 wherein said substantially elliptical magnet poles define an imaging volume having a vertical dimension in a direction parallel to the direction of said sidewalls and a horizontal dimension in a direction parallel to said horizontal pole axis such that said vertical dimension is larger than said horizontal dimension.

14. A magnetic resonance imaging apparatus comprising a magnet having a pair of elliptical elements spaced apart from each other along a horizontal magnetic field axis and defining a patient-receiving space therebetween and a patient positioning device operable to hold a patient in an upright orientation in said patient-receiving space, said elements being supported by a structure and said magnet being operable to direct flux between said elements.

15. The apparatus of claim 14 wherein said elliptical elements define an imaging volume having a vertical dimension in a direction transverse to said horizontal pole axis and a horizontal dimension in a direction transverse to said horizontal magnetic field axis such that said vertical dimension is larger than said horizontal dimension.

16. The apparatus of claim 14 wherein said structure further comprises a pair of vertically extending sidewalls, each of said sidewalls abutting each of said elements and forming a surface from which said elements project, at least one upper flux return member and at least one lower flux return member, said upper and lower flux return members extending between said vertical sidewalls.

17. The apparatus of claim 16 wherein each of said upper and lower flux return members include a height dimension in a direction parallel to said sidewalls and a width dimension substantially orthogonal to the direction of said vertical dimension and said horizontal pole axis and wherein said height dimension is greater than said width dimension.

18. The apparatus of claim 14 wherein said elements are substantially elliptical in shape.

19. The apparatus of claim 18 wherein said elliptical elements define pole faces.

20. The apparatus of claim 14 further comprising an elevator for raising or lowering said patient positioning device relative to said magnet.

21. The apparatus of claim 14 wherein said patient positioning device is operable to receive a standing patient.

22. The apparatus of claim 14 wherein said elliptical elements comprise a set of superconducting field coils.

23. The apparatus of claim 22 further comprising auxiliary coils provided in association with said superconducting field coils.

24. Magnetic resonance imaging apparatus comprising:
a magnet defining a substantially horizontal field axis and an imaging volume, said imaging volume being elongated in the vertical direction so that a vertical dimension of the imaging volume is greater than a horizontal dimension of the imaging volume transverse to the field axis; and
a patient support capable of supporting a human patient with the long axis of the patient's torso in a substantially vertical orientation.

25. The apparatus of claim 24 wherein said patient support is capable of moving the patient upwardly and downwardly so as to align different regions of the patient with the imaging volume.

26. Apparatus as claimed in claim 24 wherein said support is capable of supporting the patient in an erect posture.

27. Apparatus as claimed in claim 24 wherein said imaging volume has a vertical dimension of at least about 2 feet.

28. Apparatus as claimed in claim 24 wherein said imaging volume has a vertical dimension of at least about 3 feet.

29. Apparatus as claimed in claim 24 wherein said magnet includes a pair of ferromagnetic poles extending along said pole axis and defining a patient-receiving space therebetween, said imaging volume being disposed within said patient-receiving space.

30. Apparatus as claimed in claim 29 wherein said magnet further includes a pair of verticallyextensive side walls spaced apart from one another, said poles projecting toward one another from said side walls.

31. Apparatus as claimed in claim 30 wherein said magnet includes upper and lower ferromagnetic flux return structures extending between said side walls.

32. Apparatus as claimed in claim 31 wherein said upper flux return structure includes a pair of ferromagnetic upper flux return members and said lower flux return structure includes a pair of ferromagnetic lower flux return members, each said flux return member having a vertical dimension V and a horizontal dimension H in a direction transverse to said field axis such that H is greater than V.

33. Apparatus as claimed in claim 32 wherein, for each said flux return member, the ratio of H to V is at least about 2:1.

34. A method of conducting magnetic resonance imaging comprising:
providing a static magnetic field directed along a substantially horizontal field axis, said field being of a quality suitable for imaging within an imaging volume having a vertical dimension greater than the horizontal dimension of the imaging volume in the direction transverse to said field axis; and
supporting a patient so that the long axis of the patient's torso is substantially vertical and so that a first portion of the patient is disposed within the imaging volume; and
using said static magnetic field, acquiring magnetic resonance image data from the first portion of the patient.

35. A method as claimed in claim 34 further comprising the step of moving the patient with a vertical component of motion so as to position a second portion of the patient within the imaging volume and then, using said static magnetic field, acquiring magnetic resonance image data from the second portion of the patient.

36. A method as claimed in claim 35 wherein said step of supporting the patient is performed so as to support the patient in a standing posture.

37. A method as claimed in claim 36 wherein said patient support has a platform and the patient stands on the platform and wherein said platform is disposed adjacent a floor in a boarding condition.

38. A method as claimed in claim 37 wherein at least one step of acquiring magnetic resonance imaging data is performed while the patient support is in the boarding position.

39. A method as claimed in claim 34 wherein the patient is a normal patient, not suspected of having a particularly abnormal condition.

* * * * *

UNITED STATES PATENT AND TRADEMARK OFFICE
CERTIFICATE OF CORRECTION

PATENT NO. : 6,828,792 B1
DATED : December 7, 2004
INVENTOR(S) : Gordon T. Danby et al.

It is certified that error appears in the above-identified patent and that said Letters Patent is hereby corrected as shown below:

Column 4,
Line 24, delete "allow" and insert -- allows --.

Column 7,
Line 28, delete "are."

Column 11,
Line 11, delete "helps" and insert -- help --.

Column 13,
Line 18, change "head room" to -- headroom --.
Line 63, delete "define" and insert -- defines --.

Column 14,
Line 57, delete "form" and insert -- from --.

Column 16,
Line 17, "verticallyextensive" should read -- vertically-extensive --.

Signed and Sealed this

Third Day of May, 2005

JON W. DUDAS
*Director of the United States Patent and Trademark Office*